(12) United States Patent
Matsuoka

(10) Patent No.: US 10,108,223 B2
(45) Date of Patent: Oct. 23, 2018

(54) ELECTRONIC DEVICE HOUSING AND ASSEMBLY METHOD

(71) Applicant: Google LLC, Mountain View, CA (US)

(72) Inventor: Yoshimichi Matsuoka, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 434 days.

(21) Appl. No.: 14/617,114

(22) Filed: Feb. 9, 2015

(65) Prior Publication Data
US 2015/0153769 A1    Jun. 4, 2015

Related U.S. Application Data

(63) Continuation of application No. 13/793,560, filed on Mar. 11, 2013, now Pat. No. 8,971,026.
(Continued)

(51) Int. Cl.
*G06F 1/16*         (2006.01)
*H05K 5/03*         (2006.01)
(Continued)

(52) U.S. Cl.
CPC .......... *G06F 1/1613* (2013.01); *G06F 1/1601* (2013.01); *G06F 1/1616* (2013.01);
(Continued)

(58) Field of Classification Search
CPC .... G06F 1/1613; G06F 1/1601; G06F 1/1616; G06F 1/1633; G06F 1/1656;
(Continued)

(56) References Cited

U.S. PATENT DOCUMENTS 5,196,993 A     3/1993   Herron et al.
5,278,730 A     1/1994   Kikinis
(Continued)

FOREIGN PATENT DOCUMENTS

CN     201889363 U      7/2011
EP     2447766 A1       5/2012
(Continued)

OTHER PUBLICATIONS

Notice of Grant for Japanese Pantent Application No. 2015-526541, dated Mar. 21, 2017. 18 pages.
(Continued)

*Primary Examiner* — A. Dexter Tugbang
*Assistant Examiner* — Jeffrey Carley
(74) *Attorney, Agent, or Firm* — Lerner, David, Littenberg, Krumholz & Mentlik, LLP

(57) ABSTRACT

An electronic device includes at least one electronic component. The electronic device also includes a first housing of a single piece of metal. The first housing defines a length, a width, and a height that is less than both the length and the width. The housing has at least five side walls defining an internal cavity and an open end to the cavity that spans the width and height of the first housing. The electronic component is contained within the cavity. A cover is removably affixed over the open end of the housing so as to contribute to a retaining force applied on the electronic component therein. The first housing can be a base housing for a portable computer, and the cover can be a first portion of a hinge assembly. The electronic device can further include a display assembly operatively connected to the base housing by the hinge assembly.

8 Claims, 17 Drawing Sheets

Related U.S. Application Data

(60) Provisional application No. 61/672,041, filed on Jul. 16, 2012.

(51) Int. Cl.
  *G06F 1/18* (2006.01)
  *H05K 5/02* (2006.01)
  *H05K 5/04* (2006.01)

(52) U.S. Cl.
  CPC .......... *G06F 1/1633* (2013.01); *G06F 1/1656* (2013.01); *G06F 1/1658* (2013.01); *G06F 1/181* (2013.01); *H05K 5/0217* (2013.01); *H05K 5/03* (2013.01); *H05K 5/04* (2013.01); *Y10T 16/5406* (2015.01); *Y10T 29/49002* (2015.01)

(58) Field of Classification Search
  CPC ..... G06F 1/1658; G06F 1/181; H05K 5/0217; H05K 5/03; H05K 5/04; Y10T 29/49002
  See application file for complete search history.

(56) References Cited

U.S. PATENT DOCUMENTS

| | | | |
|---|---|---|---|
| 5,332,306 | A | 7/1994 | Babb et al. |
| 5,510,953 | A | 4/1996 | Merkel |
| 5,546,334 | A | 8/1996 | Hsieh et al. |
| 5,560,572 | A | 10/1996 | Osborn et al. |
| 5,574,625 | A | 11/1996 | Ohgami et al. |
| 5,576,929 | A | 11/1996 | Uchiyama et al. |
| 5,608,611 | A | 3/1997 | Szudarek et al. |
| 5,682,291 | A | 10/1997 | Jeffries et al. |
| 5,715,139 | A | 2/1998 | Nakajima |
| 6,064,564 | A | 5/2000 | Song et al. |
| 6,075,694 | A | 6/2000 | Mills et al. |
| 6,111,746 | A | 8/2000 | Wahl et al. |
| 6,115,242 | A | 9/2000 | Lambrecht |
| 6,198,626 | B1 | 3/2001 | Nakajima et al. |
| 6,459,591 | B2 | 10/2002 | Liu |
| 6,480,397 | B1 | 11/2002 | Hsu et al. |
| 6,560,119 | B1 | 5/2003 | Katsuyama et al. |
| 6,574,096 | B1 | 6/2003 | Difonzo et al. |
| 6,595,786 | B2 | 7/2003 | Horiuchi et al. |
| 6,842,332 | B1 | 1/2005 | Rubenson et al. |
| 7,075,785 | B2 | 7/2006 | Minaguchi et al. |
| 7,136,279 | B2 | 11/2006 | Yu et al. |
| 7,265,969 | B2 | 9/2007 | Jin |
| 7,382,612 | B2 | 6/2008 | Chan et al. |
| 7,612,997 | B1 | 11/2009 | Diebel et al. |
| 7,672,120 | B2 | 3/2010 | Kohlman et al. |
| 7,719,826 | B1 | 5/2010 | Chang et al. |
| 7,929,283 | B2 | 4/2011 | Wang |
| 7,930,011 | B2 | 4/2011 | Shi et al. |
| 8,050,020 | B2 | 11/2011 | Liu |
| 8,286,789 | B2 | 10/2012 | Wilson et al. |
| 8,687,359 | B2 | 4/2014 | Theobald et al. |
| 8,821,678 | B1 | 9/2014 | Yu et al. |
| 8,861,191 | B1 | 10/2014 | Yu et al. |
| 8,971,026 | B2 | 3/2015 | Matsuoka |
| 8,995,125 | B2 | 3/2015 | Matsuoka et al. |
| 2001/0015005 | A1 | 8/2001 | Chung et al. |
| 2002/0006031 | A1 | 1/2002 | Liu |
| 2002/0061736 | A1 | 5/2002 | Boman et al. |
| 2002/0085338 | A1 | 7/2002 | Lin |
| 2003/0021082 | A1 | 1/2003 | Lu et al. |
| 2003/0100275 | A1* | 5/2003 | Hsu ........................ H04B 15/00 455/575.1 |
| 2004/0001307 | A1 | 1/2004 | Takakusaki |
| 2004/0012509 | A1 | 1/2004 | Chen |
| 2004/0134253 | A1* | 7/2004 | Kim ........................ B21D 35/00 72/379.2 |
| 2004/0160738 | A1 | 8/2004 | Chen et al. |
| 2004/0246669 | A1 | 12/2004 | Minaguchi et al. |
| 2005/0018391 | A1 | 1/2005 | Jin |
| 2005/0023022 | A1 | 2/2005 | Kriege et al. |
| 2006/0099837 | A1 | 5/2006 | Cheng et al. |
| 2006/0176659 | A1 | 8/2006 | Sun et al. |
| 2006/0227502 | A1 | 10/2006 | Cheng |
| 2006/0268502 | A1 | 11/2006 | Liu et al. |
| 2006/0268528 | A1 | 11/2006 | Zadesky et al. |
| 2007/0020981 | A1 | 1/2007 | Matsuo |
| 2007/0025072 | A1* | 2/2007 | Liao ........................ G06F 1/1616 361/679.21 |
| 2007/0081318 | A1 | 4/2007 | Lynch et al. |
| 2007/0127204 | A1 | 6/2007 | Muenzer et al. |
| 2007/0230101 | A1 | 10/2007 | Wong et al. |
| 2008/0019085 | A1 | 1/2008 | Nakajima |
| 2008/0037771 | A1* | 2/2008 | Black .................. H04M 1/0266 379/433.01 |
| 2008/0259537 | A1 | 10/2008 | Arisaka et al. |
| 2008/0259540 | A1 | 10/2008 | Takayanagi et al. |
| 2008/0265024 | A1 | 10/2008 | Tracy et al. |
| 2008/0304214 | A1 | 12/2008 | Nakajima |
| 2009/0040703 | A1* | 2/2009 | Gotham .................. H05K 5/02 361/679.02 |
| 2009/0059493 | A1 | 3/2009 | Iwamoto et al. |
| 2009/0091879 | A1 | 4/2009 | Lim |
| 2010/0014237 | A1 | 1/2010 | Takizawa |
| 2010/0039761 | A1 | 2/2010 | Wang |
| 2010/0091442 | A1 | 4/2010 | Theobald et al. |
| 2010/0277858 | A1 | 11/2010 | Zhou |
| 2011/0051360 | A1 | 3/2011 | Dabov et al. |
| 2011/0085286 | A1 | 4/2011 | Tanaka et al. |
| 2011/0211306 | A1 | 9/2011 | Murakami et al. |
| 2011/0222238 | A1 | 9/2011 | Staats et al. |
| 2012/0030930 | A1 | 2/2012 | Theobald et al. |
| 2012/0036322 | A1 | 2/2012 | Klein |
| 2012/0050975 | A1 | 3/2012 | Garelli et al. |
| 2012/0092821 | A1 | 4/2012 | Raff et al. |
| 2012/0099264 | A1 | 4/2012 | Degner et al. |
| 2012/0120562 | A1 | 5/2012 | Prest et al. |
| 2014/0016257 | A1* | 1/2014 | Matsuoka ................ H05K 5/03 361/679.26 |
| 2014/0043744 | A1* | 2/2014 | Matsuoka ............ G06F 1/1658 361/679.09 |
| 2015/0092332 | A1 | 4/2015 | Yu et al. |
| 2015/0153769 | A1 | 6/2015 | Matsuoka |

FOREIGN PATENT DOCUMENTS

| | | |
|---|---|---|
| JP | H02-133126 A | 5/1990 |
| JP | H07-016023 A | 3/1995 |
| JP | H07-200121 A | 8/1995 |
| JP | H08-090211 | 4/1996 |
| JP | 08264980 | 10/1996 |
| JP | H11-348072 A | 12/1999 |
| JP | 2000188491 A | 7/2000 |
| JP | 2000257313 A | 9/2000 |
| JP | 2002045956 A | 2/2002 |
| JP | 2002221925 A | 8/2002 |
| JP | 2002263820 A | 9/2002 |
| JP | 2004241091 A | 8/2004 |
| JP | 2005346185 A | 12/2005 |
| JP | 2009080800 A | 4/2009 |
| JP | 2009296026 A | 12/2009 |
| JP | 2012505482 A | 3/2012 |
| JP | 2012119666 A | 6/2012 |
| JP | 2013508818 A | 3/2013 |
| KR | 20110076951 A | 7/2011 |
| TW | 488610 U | 5/2002 |
| WO | 2010039132 A1 | 4/2010 |
| WO | 2010045161 A1 | 4/2010 |

OTHER PUBLICATIONS

Notice of Office Action dated Aug. 18, 2016, for Korean Patent Application No. 10-2015-7020518.
Examiner's Report dated May 25, 2016, for Canadian Patent Application No. 2,879,309.
Office Action for Korean Patent Application No. 10-2015-7020518, dated Apr. 27, 2017.

(56) References Cited

OTHER PUBLICATIONS

Korean Office Action for Application No. KR 10-2015-7004192 dated Mar. 16, 2015.
Notification of First Office Action for Chinese Patent Application No. 201380051295.9, dated Nov. 4, 2015.
Japanese Office Action for Application No. 2015-526541 dated Jul. 7, 2015.
Office Action for European Patent Application No. 13819498.0 dated Apr. 12, 2016.
Notification of First Office Action for Chinese Patent Application No. 201380043110.X, dated Nov. 23, 2015.
Extended European Search Report for EP Patent Application No. 13827899.9, dated Dec. 21, 2015.
Pre-Appeal Re-Examination Report for Japanese Patent Application No. 2015-526541 dated May 30, 2016.
Pre-Appeal Re-Examination Report for Japanese Patent Application No. 2015-523143 dated May 27, 2016.
Korean Office Action for Application No. 10-2015-7005993 dated May 6, 2015.
Notice of Grounds of Rejection for Japanese Patent Application No. 2015-523143, dated Nov. 22, 2016.
Extended European Search Report for Application No. 13819498.0 dated May 28, 2015.
International Search Report and Written Opinion for Application No. PCT/US2013/050262 dated Oct. 24, 2013.
International Search Report and Written Opinion for Application No. PCT/US2013/050243 dated Jan. 7, 2014.
Allowance of Patent dated Sep. 5, 2016, for Korean Patent Application No. 10-2015-7015941.
Office Action for Korean Patent Application No. 10-2015-7015941 dated Apr. 21, 2016.
Notification of the Second Office Action dated Jul. 5, 2016, for Chinese Patent Application No. 201380043110.X.
Notice of Grant for Japanese Patent Application No. 2017-014130 dated Dec. 12, 2017. 3 pages.

* cited by examiner

ELECTRONIC DEVICE HOUSING AND ASSEMBLY METHOD

CROSS-REFERENCE TO RELATED APPLICATIONS

The present application is a continuation of U.S. patent application Ser. No. 13/793,560, filed Mar. 11, 2013, which application claims the benefit of the filing date of U.S. Provisional Application No. 61/672,041 filed Jul. 16, 2012, the disclosures of which are incorporated by reference herein.

BACKGROUND

Housings for portable notebook or clamshell-style computers can be made from a number of plastic panels or sections that are assembled onto a metal frame. The metal frame is structured to retain and attach together the computer's internal components. Such internal components can include a printed circuit board that carries the computer's central processor and any additional processors such as for graphics or the like as well as the computer's random-access memory (RAM). Additional components include batteries, input devices such as a keyboard and trackpad or the like, storage memory (such as a hard drive, solid-state drive, or the like, communications devices (such as for WiFi connection and networking), removable memory devices (such as CD- or DVD-R/W drives), and structures for external peripheral connections.

In a frame-based housing structure, all such components can be affixed to the frame, which itself can be made up of several different parts. The components of the housing are in turn attached to the frame to provide a somewhat uniform external appearance and to provide protection for the internal components. In a notebook (or clamshell) configuration, the arrangement just described can make up a base unit that is configured to rest on a surface. Another assembly in the form of a lid, or display, housing can be attached to the base housing by a hinge. The lid housing can include a video display, which can be in the form of a LCD panel with various forms of backlighting associated therewith. Similar to the base housing, the display (and any other components also included within the lid housing) can be affixed to another frame to which other housing sections or panels are affixed to enclose the lid assembly. The hinge can be attached to both the frame of the lid and the frame of the base with portions thereof extending through openings between or within the housing sections or panels.

The hinged attachment between the base and lid housings can allow the computer to be moved between open and closed configurations. The closed configuration being such that the lid is positioned against the base with the display and input devices positioned internally of the housing units for protection thereof during transportation. In the open configuration, the display is viewable and the input devices are accessible to the user. The lid can be rotated through a range of positions to provide for comfortable viewing of the display.

Such frame-based housing configurations can be complicated to assemble and to disassemble for repair or maintenance reasons. Further, they can be bulky due to the number of components and the complex assembly patterns required. Further, the number of joints or connections between components can provide a number of potential failure areas that can reduce the overall strength and protection provided by such housings.

While many notebook computers still use such a housing structure, other structures have been developed that seek to combine the utility of the frame into a part of the housing units and to reduce the overall number of exterior pieces that make up the housing. Such structures can be made from metal and can, for example, include in one unit the top wall of a base housing (that surrounds the keyboard) along with the front and side walls thereof. This unit can also have internal reinforcement and can include attachment structures (such as threaded holes) for attachment of the internal components). A separate unit can define the bottom wall of the base and can attach to the upper housing unit. Such structures can provide for easier assembly of components but can still include major failure locations along the large attachment areas between housing components.

BRIEF SUMMARY

An aspect of the present disclosure relates to an electronic device. The electronic device includes at least one electronic component. The electronic device also includes a first housing of a single piece of material. The first housing defines a length, a width, and a height that is less than both the length and the width. Further, the housing has at least five side walls defining an internal cavity and an open end to the cavity that spans the width and height of the housing. The electronic component is contained within the cavity. A cover is removably affixed over the open end of the first housing so as to contribute to a retaining force applied on the electronic component therein.

In an example, the single piece of material can be of metal. The first housing can be a base housing for a portable computer, and the cover can be a first portion of a hinge assembly. In such an example, the device can further include a lid assembly operatively connected to the base housing by the hinge assembly. The lid assembly can include a lid housing substantially of a single piece of metal and having at least five side walls defining an internal cavity and an open end thereto. The lid assembly can further include a display unit received within the cavity of the lid housing, and the hinge assembly can include a second portion removably affixed over the open end of the lid housing.

At least one of the side walls of the first housing can include an opening to expose a portion of the electronic component. In such an example, the electronic component can be a trackpad assembly including a touch-sensitive surface, and the touch-sensitive surface can be exposed within the opening. Additionally or alternatively, the electronic component can be a keyboard assembly including a plurality of keys, and at least the keys of the keyboard assembly can be exposed within the opening. In a further example, the electronic component can include at least one external connection element, and the at least one external connection element can be exposed within the opening.

The electronic component can be positioned within a space defined between two spaced apart and parallel ones of the side walls. In such an example the device can further include a shim member wedged between the electronic component and a first one of the two side walls to force at least a portion of the electronic component into contact with a second one of the two side walls. The shim member can be a portion of a second electronic component received within the internal cavity of the housing. Additionally or alternatively, at least one of the side walls can include a hole therethrough, and the electronic component can include a threaded hole therein aligned with the hole in the side wall. In such an example, the device can further include a screw passing through the hole in the housing and engaging with the threaded hole of the electronic component. The device can further include a support member contacting at least two of the side walls of the housing within the internal cavity. The support member can be assembled with the electronic component to secure the component within the housing.

The electronic component can be one of a plurality of electronic components within the housing. At least some of such electronic components can contact at least one of the side walls, respectively and the at least some of the electronic components can contact each other along respective portions thereof to help retain the at least some of the electronic components in predetermined positions within the housing. The cover can exert a retention force on the electronic component to help retain the electronic component in a predetermined position within the housing.

Another aspect of the present disclosure relates to an electronic housing assembly. The assembly includes a first housing unit of a single piece of metal. The first housing unit defining a length, a width, and a height that is less than both the length and the width, the housing unit having at least five side walls defining an internal cavity and an open end to the cavity that spans the width and height of the housing unit. The assembly further includes a cover removably affixed over the open end of the first housing unit. The first housing unit is made by a process including deep drawing a single, substantially flat sheet of a metal material in a direction away from the open end formed thereby.

The assembly can include at least one electronic component received within the first housing unit, and the process of making the first housing unit can further include deep drawing the sheet of metal material into a form configured to receive the at least one electronic component therein. The electronic component can include a threaded hole therein, and the process of making the first housing unit can further include forming a hole through at least one of the side walls configured to align with the threaded hole in the electronic component. The process of making the first housing unit can further include forming an opening in at least one of the side walls to expose at least a portion of the electronic component. The opening can be formed by laser cutting, by milling, or by other processes.

The deep drawing process can be carried out using a mold that can impart an outside form of the housing on the sheet of metal material. The outside form can include respective outside surfaces of the side walls of the first housing unit. The process can further be carried out using a tool that can impart an inside form of the first housing unit on the sheet of metal material. The inside form can include respective inside surfaces of the side walls that define the internal cavity. The outside form of the first housing unit imparted by the mold can be an initial outside form that can include initial outside surfaces of the side walls. In such an example the process can further include removing material from the first housing unit, including the initial outside surfaces of the side walls. Removing material from the first housing unit can be carried out by milling, grinding, polishing, or other processes. Removing material from the first housing unit can reduce a radius on a corner between adjacent side walls of the initial outside form.

Another aspect of the present disclosure relates to a method for assembling an electronic device. The method includes inserting an electronic component into a first housing through an open end thereof. The first housing is of a single piece of metal, and defines a length, a width, and a height that is less than both the length and the width. The first housing has at least five side walls around an internal cavity and an open end to the cavity that spans the width and height of the first housing. The method also includes removably affixing a cover over the open end of the first housing so as to contribute to a retaining force applied on the electronic component therein.

The cover can be a first portion of a hinge assembly and the first housing can be a base housing for a base assembly of a portable computer. In such an example, the method can further include attaching a lid assembly with a second portion of the hinge assembly. The hinge assembly can be configured for operatively connecting the display assembly to the base housing. The lid assembly can include a lid housing, and the method can further include inserting a display unit into the lid housing through an open end thereof. Further, the lid housing can be of a single piece of metal, and can define a length, a width, and a height that is less than both the length and the width. The lid housing can have at least five side walls around an internal cavity and an open end to the cavity that spans the width and height of the lid housing, and assembling the lid assembly with the second portion of the hinge assembly causes the second portion of the hinge assembly to contribute to a retaining force applied on the display unit therein.

The method can further include forming an opening in at least one of the side walls of the first housing to expose a portion of the electronic component. In an example where the first housing is a base housing for a notebook computer, the electronic component can be trackpad assembly having a touch-sensitive surface. Further, the method can include moving the trackpad into a position within the base housing such that the touch-sensitive surface is exposed in the opening formed in the housing and is substantially flush with an outside surface of the side wall in which the opening is formed.

The method can further include inserting a shim member between one of the side walls and the electronic component. The shim member can be a part of second electronic component, and inserting the shim member can include inserting the second electronic component through the open end of the first housing into the cavity.

The method can further include inserting a plurality of electronic components into the first housing through the open end thereof such that the electronic components are in mutually contacting relationships among each other within the first housing. At least one electronic component can contact the cover and another electronic component can contacts a side wall opposite the cover. In such an example, the mutually contacting relationships among the electronic components can be such that a combination of electronic components spans a length between the cover and the opposite side wall.

The method can further include forming the first housing from a single, flat metal sheet by deep drawing the sheet in a direction away from the open end formed thereby. The deep drawing process can be carried out using a mold that imparts an outside form of the first housing on the sheet of metal material. The outside form can include respective outside surfaces of the side walls of the first housing. The deep drawing process can further be carried out using a tool that imparts an inside form of the first housing on the sheet of metal material. The inside form can include respective inside surfaces of the side walls adjacent the internal cavity.

Another aspect of the present disclosure relates to a method for making an electronic device housing. The method can include deep drawing a single, substantially flat sheet of a metal material in a first direction to form a first housing unit of a single piece of metal. The first housing unit can define a length, a width, and a height that is less than both the length and the width. The first housing unit can have at least five side walls defining an internal cavity and an open end to the cavity that spans the width and height of the housing unit such that the length of the housing extends in the first direction. The method can further include removably affixing a cover over the open end of the first housing unit.

DETAILED DESCRIPTION

Figure 1:
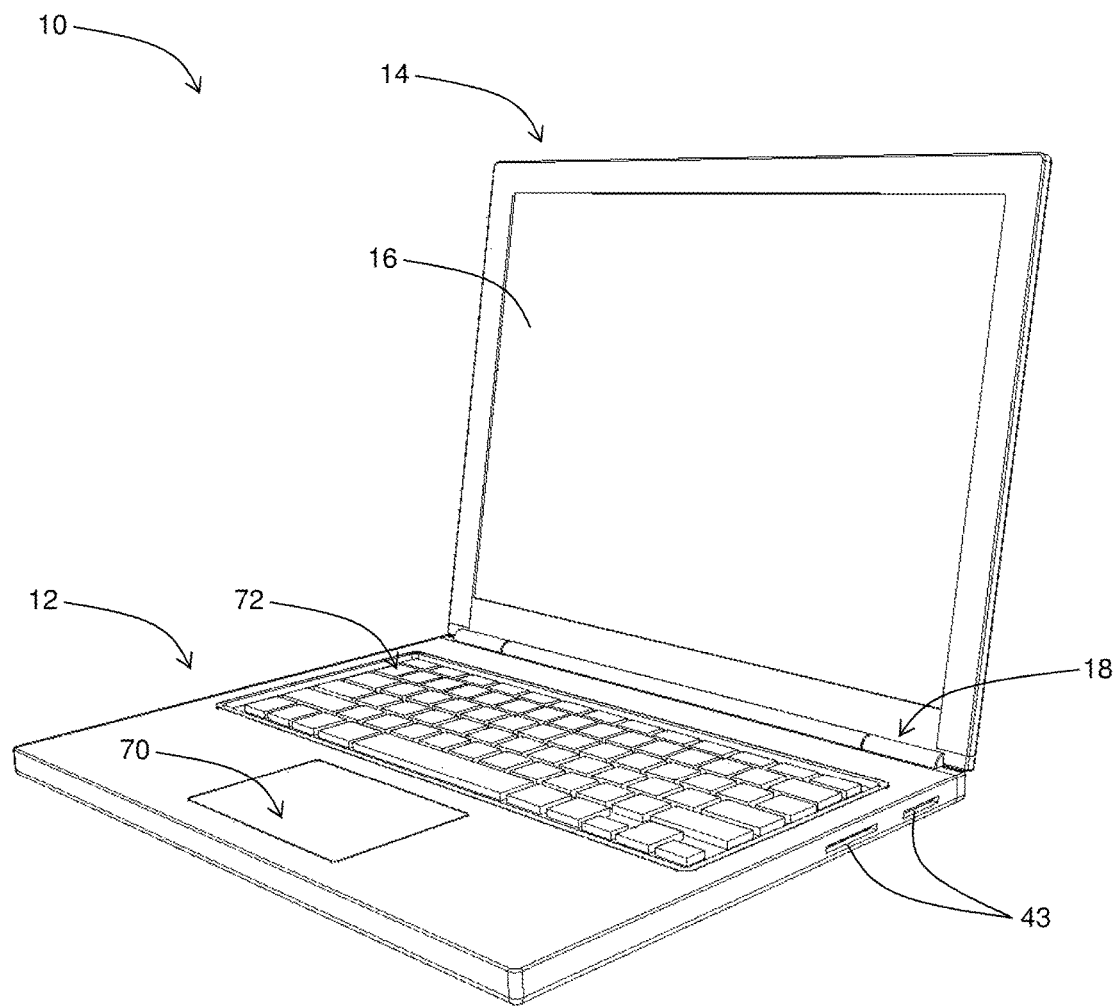
FIG. 1 shows a portable computer according to an embodiment of the present disclosure.

Turning to the drawings, FIG. 1 shows a portable computer 10 in the form of a "notebook" or "clamshell" computer with a base 12 configured to rest on a surface and to support a lid 14 including a screen 16. Lid 14 is connected to base 12 by a hinge 18 that allows the lid 14 to close against the base 12 and to be opened by rotation away therefrom into a user-selectable viewing position during use of the computer 10.

Base 12 includes a keyboard 72 and a trackpad 70 for user input to computer 10. The trackpad 70 can also be referred to as a touchpad and can include any type of touch-sensitive input, operating by capacitive, magnetic, resistive, surface-acoustic wave or other forms of touch-sensitivity. Both the keyboard 72 and trackpad 70 are mounted to base so that they are exposed at (or otherwise available for user interaction on) an outside surface of the upper wall 26 of the base 12. It is noted that the terms "upper", "lower", and other terms related to relative positions of elements are done with respect to the frame of reference depicted in FIG. 1. Such terms are used for convenience and do not limit the actual positions of the elements should the device be repositioned.

Figure 2:
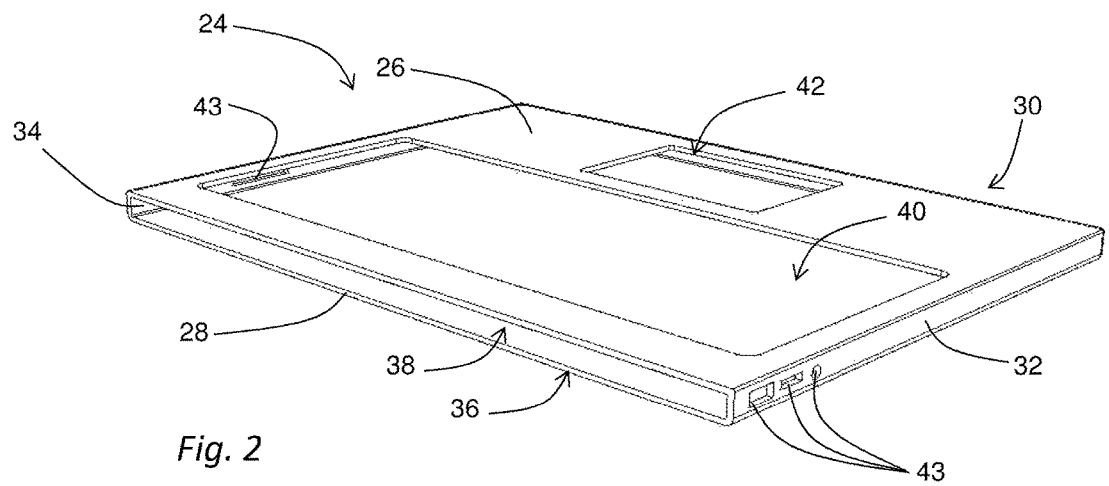
FIG. 2 shows a base housing unit that can be used as a portion of the portable computer of FIG. 1.

Base 12 includes a housing 24, shown in FIG. 2, that consists of a unitary material structure that includes the upper wall 26, a lower wall 28 that is spaced apart from and opposes upper wall 26, a front wall 30, and two side walls 32 and 34, that extend generally vertically between the upper wall 26 and lower wall 28. In such a unitary structure, a single piece of material includes the aforementioned walls, 26, 28, 30, 32, and 34 with any one of these walls being solidly, or unitarily, connected with the adjacent walls by continuous, uninterrupted, sections of the same material. For example, the housing 24 can be made from a single piece of plastic or metal wherein the walls are integrally formed with the adjacent walls without any joining in the form of fastening, gluing, welding, or metallic joining such as soldering, braising or the like. Plastic materials can include polycarbonate (PC), ABS, PCABS, or the like. Metal materials can include aluminum, aluminum alloy, magnesium alloys, stainless steel, or the like. Such a housing with the described solid connections between walls can be made by injection molding metal or plastic, by die-casting metal or by a deep drawing process applied to a metal sheet, as described below.

As further shown in FIG. 2, housing 24 defines an open end 36 opposite front wall 30 and bounded by edges of the upper 26, lower 28, and side walls 32 and 34. Open end 36 provides access to an interior 38 of base housing 24 that is configured to enclose various internal components of the computer 10. Base housing 24 also includes a keyboard opening 40 and a trackpad opening 42 that generally follow the facial profiles of the respective keyboard 72 and trackpad 70 such that they can be assembled therein and accessed by a user. A number of peripheral connection openings 43 to the interior 38 can also be included in housing 24, for example through either of the side walls 32 or 34, and can allow for access to peripheral connections for computer 10 such as for a power adapter plug, a USB device, one or more memory cards, audio devices, or the like.

Housing 24, when configured as a single piece of material that includes upper wall lower wall 28, front wall 30, and side walls 32 and 34, can be stronger than other notebook computer housing structures. In particular, the torsional strength (or resistance to axial twisting, can be increased relative to multi-part housing structures. This can make the housing 24, and accordingly the computer 10 overall, more resistant to, for example, being dropped on a side edge or a corner. Additionally, such a housing configuration can make the assembly process of the computer 10 easier and can further enhance the visual appearance of the computer 10 by eliminating parting lines, seams, or fasteners associated with assembling multiple components into a single housing.

Lid 14 can also include a housing 44 configured with multiple, solidly joined, walls of a single piece of material. In the example shown in FIG. 3, lid housing 44 is a solid, or unitary, piece of material that defines an upper wall 46 that is generally positioned away from the upper wall 26 of the base housing 24 when lid 14 is in the closed position. Lid housing 44 also includes a bezel wall 48 that is positioned opposite from upper wall 46 and is spaced apart therefrom. Bezel wall 48 can be configured to surround at least part of the display screen 16 associated with lid 14. As further shown in FIG. 5, bezel wall 48 can help retain a display assembly 60 that is configured to be positioned within lid housing 44. As such, bezel wall 48 can oppose upper wall 46, which can contact display assembly 60 on a side thereof opposite bezel wall 48.

Lid housing 44 also defines an open end 56 that is positioned opposite front wall 50. Open end 56 is bounded by edges of the upper wall 46, the side walls 52 and 54, and at least portions of bezel wall 48. In the example shown in FIG. 3, bezel wall is solidly joined with and extends inwardly from both side walls 52, 54 and front wall 50. Lid housing 44 also defines a display opening 58 through which at least the screen portion 16 of the display assembly 60 is viewable by a user. The distance by which bezel wall 48 extends inward can vary depending on the configuration of, for example, display assembly and/or the materials from which lid housing 44 is constructed.

Figure 3:
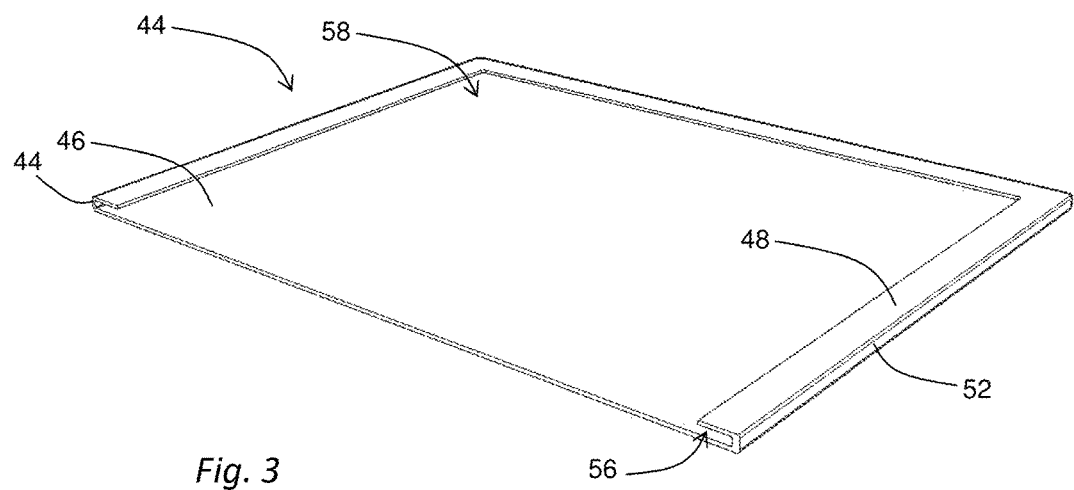
FIG. 3 shows a lid housing unit that can be used as a portion of the portable computer of FIG. 1.

In the example shown in FIG. 3, bezel wall 48 bounds open end 56 only along the distance by which the respective portions thereof extend inward from side walls 52 and 54, leaving a portion of open end 56 unbounded. Such an arrangement is also such that display opening 58 only bounds screen 16 on three sides thereof and is open to a portion of open end 56. In other embodiments, bezel wall 48 can extend from one side wall 52 to the other side wall 54 such that a portion of bezel wall 48 separates display opening 58 (which can be bounded on four sides) from open end 56.

Figure 4:
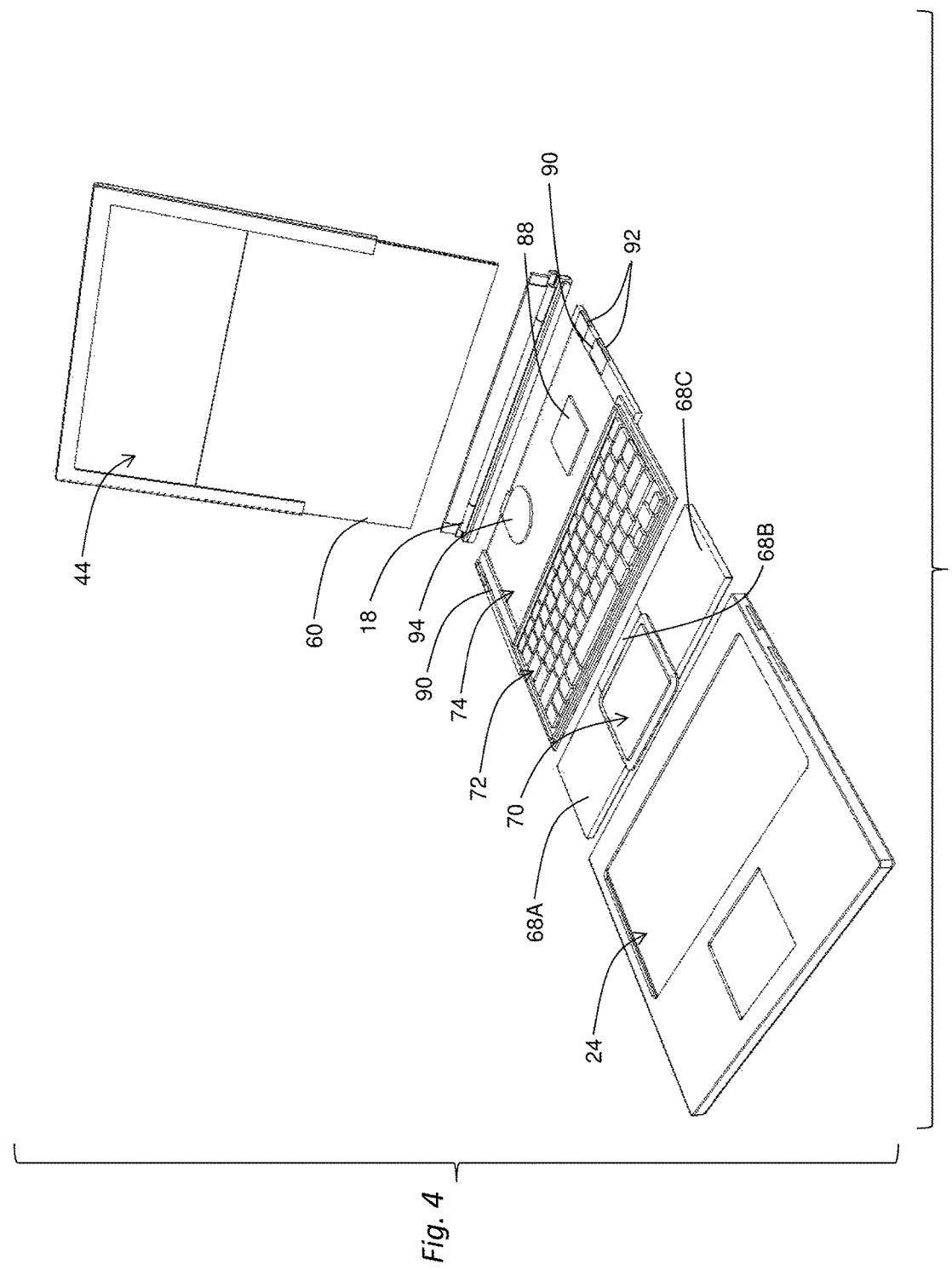
FIG. 4 shows an exploded view of the portable computer of FIG. 1 and various components that can be included therein.
Figure 6:
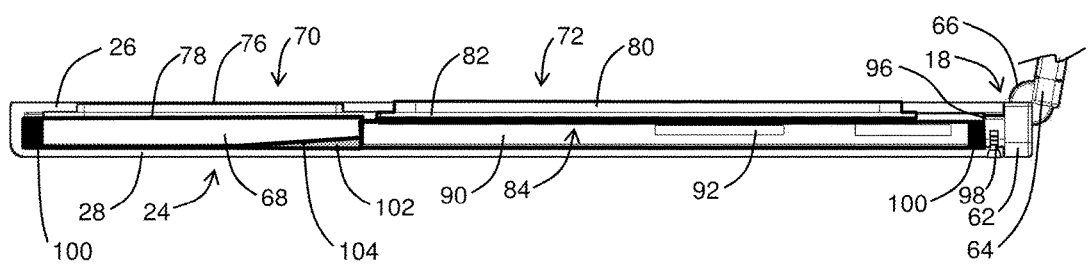
FIG. 6 shows a partial cross-sectional view of the portable computer of FIG. 1.

As shown in FIGS. 1, 4, and 6, a hinge assembly 18 can connect base 12 with lid 14. Hinge assembly 18 can include a base portion 62 (FIG. 6) that is configured to attach with base housing 24 and to cover open end 36 thereof. Similarly, a lid portion 64 of hinge assembly 18 can attach with lid housing 44 to cover open end 36 thereof. A joint 66 or a plurality of joints 66 can connect base portion 62 to lid portion 64 and can be configured to allow base portion 62 to articulate with lid portion 64 to provide the desired range of rotation between base 12 and lid 14. The example of joint 66 shown in the figures is in the form of a barrel, or piano, style hinge, but other forms of notebook computer hinges can be implemented in a similar structure.

Figure 5:
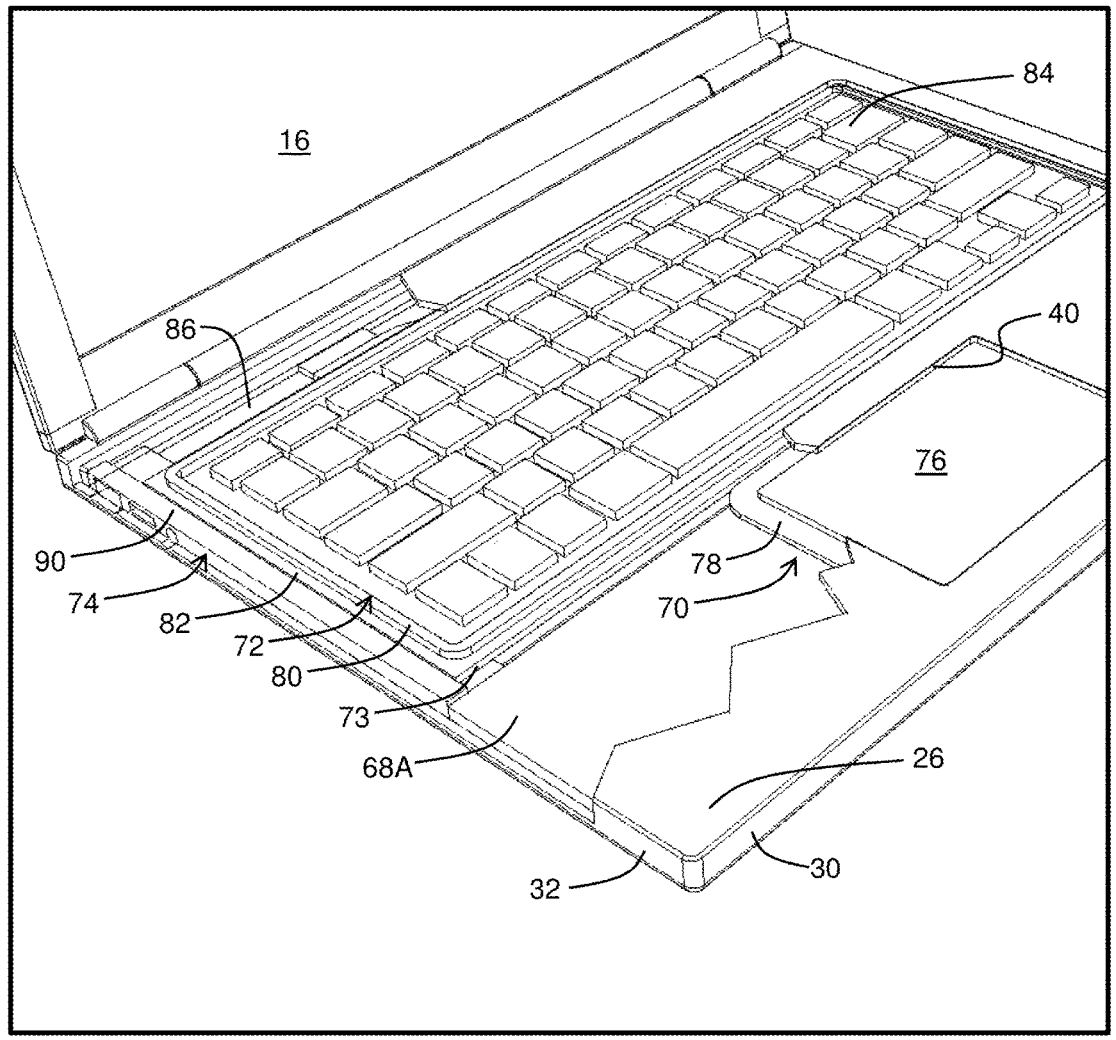
FIG. 5 shows a partial cutaway view of the portable computer of FIG. 1.

As shown in FIGS. 4-6, base housing 24 and lid housing 44 can be configured to work with base portion 62 and lid portion 64, respectively, of hinge assembly 18 to retain appropriately-configured internal components therein. Specifically, base housing 42 can be configured to retain one or more batteries 68, a trackpad assembly 70, a keyboard assembly 72, and a board assembly 74. These components can be configured to contact one another, various portions of the interior 38 of base housing 24, and portions of a surface of hinge base portion 62 that cover open end 36 such that the components are retained within base housing 24 and are secured in their respective positions.

As shown in the exploded view of FIG. 4, the components as well as interior 38 of base housing 24 can be configured such that the components can be slid into base housing 24 through open end 36 thereof. The components can further be configured such that they engage with each other and with base housing 24 such that the positions of the components are maintained once assembled in a particular manner. In the example shown in FIG. 4 and in the cutaway view of FIG. 5, the one or more batteries 68 can be configured to contact the interior of lower wall 28 and the front wall 30 along portions thereof. For instance, batteries 68A and 68C can be configured to contact respective portions of the adjacent ones of side walls 32 and 34 with battery 68B positioned between and in mutual contact with batteries 68A and 68C. The batteries 68 can be configured to be spaced apart from the interior of upper wall 28. This configuration can allow for trackpad assembly 70 to be positioned between at least portions of the batteries 68 and upper wall 28.

Trackpad assembly 70 can include various sub-components commonly associated with trackpads or other touch-sensitive input devices. This can include a touch sensitive substrate 76 that defines the actual surface with which the user interacts. The trackpad assembly 70 can also include a support structure 78 that can retain substrate 76 and can include associated circuitry or other functionality, such as structures to provide a clickable trackpad surface or the like. Support structure 78 can be configured to extend outwardly around substrate 76 such that substrate 76 can fit within opening 42 with support structure contacting the portion of upper wall 26 that surrounds opening 42. Opposite the upper wall 26, support structure 78 can contact one or more of the batteries 68. In such a configuration, batteries 68 and support structure 78 can be configured such that, when stacked atop one another, they extend completely between lower wall 28 and upper wall 26. This can, among other things, retain the position of trackpad assembly 70 through a combination of the fit of substrate 76 within opening 42 and the friction generated between the batteries 68, the trackpad assembly 70 and the upper and lower walls 26 and 28.

Similar to trackpad assembly 70, keyboard assembly 72 can be structured to engage with keyboard opening 40. As illustrated in FIGS. 5 and 6, keyboard assembly 72 can include a support structure 73 with a raised portion 80 surrounded by an outwardly extending flange portion 82. Keyboard support structure 73 can be configured such that raised portion 80 fits within keyboard opening 40 and such that flange 82 can contact the interior surface of upper wall 26 when raised portion 80 is within opening 40. Support structure 73 can also support the various keyboard keys 84 and any related circuitry such that keyboard assembly 72 can be a self-contained unit.

Further, board assembly 74 can be configured to fit between keyboard support structure 73 and the interior surface of lower wall 28. As shown in FIGS. 5 and 6, keyboard assembly and board assembly 74 can be configured such that board assembly can contact the interior surface of lower wall 28 with keyboard support structure 73 being retained in a position such that raised portion 80 is within opening 40 and flange 82 is held in contact with upper wall 26 by board assembly 74.

As shown in FIG. 4, board assembly 74 can include a printed circuit board 86, or a plurality of printed circuit boards attached together, supported on a common structure, or the like. The board 86, shown in FIG. 4, can be in the form of a motherboard or the like that can provide interconnections between various semiconductor chips or other microelectronic elements that can be carried thereon as well as with external components, such as power supplies, memory, etc. In the simplified example shown in the figures, board 86 is shown including a microprocessor 88 carried thereon. The microprocessor 88 can implement various functionality of the computer 10, including receiving user input, providing output either directly or through communication with a graphics processor or the like, and allocating memory usage and retrieving stored data from memory. Board 86 is also shown with a fan 94 thereon to provide cooling for the components within base 12. The board 86 can also include one or more memory structures in the form of RAM or other similar components. The board 86 can also include connections for communication with the batteries 68, the trackpad assembly 70, the keyboard 72 and the display assembly 60.

Board assembly 74 can also include end units 90 that can be positioned on opposite sides of board 86 that are disposed toward the side walls 32, and 34 of the base housing 24. Additionally or alternatively, end units can be positioned along the sides of board 86 that extend between those adjacent the side walls. In another example, board 86 can be supported by or contained within a single housing unit that substantially covers a portion of the board 86 itself. As shown, end units 90 are configured to contact the lower wall 28 of base housing 24 on an interior surface thereof. End units 90 are also configured to respectively contact the interior surfaces of the side walls 32 and 34 with board 86 spacing apart end units 90 to maintain such contact. In this arrangement, board 86 can be supported in a position such that it does not directly contact the interior of base housing 24 and such that the delicate components carried thereon are isolated from coming into contact with other internal features of the base 12, which could cause damage thereto.

End units 90 can also include various input or output port structures 92. Such ports 92 can include connections for an external power supply, or connections specially configured as, e.g., USB, Fire-Wire, HDMI, or other similar connections. Ports 92 can also include SD card reader slots, or audio input or output connections. The conductive features of the ports can connect with the circuitry of the board 86 for communication therewith. Further the ports 92 can align with port openings 43 in the base housing 24 such that components can connect with ports 92 through housing 24.

End units 90 can further be configured to provide the spacing necessary to maintain the desired position for keyboard assembly 73 discussed above. Specifically, when end units are positioned within base housing 24 such that they contact the interior of lower wall 28, they can support keyboard assembly 72 on a side opposite lower wall 28 such that flange 82 contacts the interior of upper wall 26 with raised portion positioned within keyboard opening 40. Such a configuration, can allow for board assembly 74 to be easily removed for repairs, upgrading (such as replacing or adding memory), or replacement with a similarly-configured board assembly 74 to be swapped for the existing board assembly. This can be done for purposes of repair, such as replacing a damaged board assembly 74 or upgrading, such as by replacing a board assembly 74 for a new board assembly 74 with, for example, a faster processor or the like. This configuration can also streamline custom manufacture of notebook computers, allowing for a number of pre-assembled board assemblies 74 with different processors, memory configurations, etc. to be provided and selected from according to customer-specifications during assembly of computer 10. In addition, the above-described configuration of the other internal components can similarly provide for easier repair/replacement thereof.

As discussed above, base portion 62 of hinge assembly 18 can be configured to close open end 36 of base housing 24 such that the internal components of base 12 are retained therein. As shown in FIG. 6, base portion 62 can be configured to contribute to the retention of the internal components of base 12 in their respective positions. In the example shown, wherein batteries 68 contact the interior of front wall 30 and board assembly 74 contacts batteries 68 opposite front wall 30, an interior surface 96 of hinge base portion 62 can contact board assembly 74 opposite battery 68. In this manner, these interior components of base 12 are in continuous contact between front wall 30 and surface 96 of hinge base portion 62, which maintains the components in their positions therebetween. Other configurations for such internal components are possible in which continuous contact between components is maintained between front wall 30 and hinge base portion 62 and could be determined based on the particular components used and the general shapes thereof.

Hinge base portion 62 can affix to base housing 24 by various fasteners that engage between base housing 24 and hinge base portion 62. In the example of FIG. 6, one or more screws passes through lower wall 28 and engages with hinge base portion 62. A similar screw can pass through upper wall 26 or one or both side walls 32 and 34. Alternatively, snap-fit structures can be used to affix hinge base portion 62 with base housing 24. As further alternatives, press-fit structures or adhesives can be used.

Embodiments of hinge assembly 18 can include wire routing therethrough such that a connection can be made, for example, between board assembly 74 and display assembly 60 to supply power and a video signal to display assembly 60. Additionally, wire segments can be included with hinge assembly 18 that extend from base portion 62 and lid portion 64 thereof for connection with wire segments connected with board assembly 74 and display assembly 60, respectively. Similar wiring can be present among components within base housing 24 to connect, for example board assembly 74 with trackpad assembly 70 and/or keyboard assembly 72. Additionally or alternatively, conductive connections can be positioned on adjacent components so that, when assembled into base housing 24, electrical connection is achieved between components, for example battery 68 and board assembly 74. Hinge base portion 62 can also include an opening or openings that align with an output of fan 94 to allow air to pass therethrough.

Compliant inserts 100 can be positioned between various internal components of base 12. These inserts 100 can be compressible and can be made of various foams, rubbers, elastomers or the like. The presence of inserts 100 between components or between a component and one of the walls of housing 24 can take up extra space between components or between a component and a wall that can arise due to manufacturing tolerances. This can allow for a more precise fit of components within housing 24 and can minimize the movement of components within housing 24 without requiring particularly tight tolerances of the components or of housing 24. These inserts 100 can be affixed to or assembled with the various components in strategic positions. For example, as shown in FIG. 6, an insert 100 can be affixed to battery 68 at a location such that insert 100 will be positioned between front wall 30 and battery 68. As also shown, another insert 100 can be attached to keyboard assembly 72 in a position to contact surface 96 of hinge base portion 62. Additional inserts 100 can be affixed to either trackpad assembly 70 or board assembly 72 to contact the other of these components. Still further inserts 100 can be positioned between battery 68 and trackpad 70, between board assembly 74 and keyboard assembly 72, or between any of the components and upper wall 26, lower wall 28, or side walls 32 and 34.

As shown in FIG. 6, one or more wedge elements 102 can also be assembled within base housing 24 adjacent one or more of the above-described internal components. The use of such wedge elements 102 can help to retain the desired positions of the internal components within base housing 24.

In the example shown in FIG. 6, wedge element 102 is positioned beneath a battery 68 such that on one side it contacts battery 86 and, on the other, it contacts the interior surface of lower wall 28. As also shown, the portion of battery 68 that wedge element 102 contacts can include an inclined surface 104 that is configured to mutually contact the wedge element 102 along a portion of the area thereof. This can allow for more even contact of battery 68 with, for example, trackpad assembly 70 on the side opposite wedge element 102. By using wedge elements 102 as shown, battery 68 can be pushed by wedge element 102 toward upper surface 26 of base housing 24, creating pressure of trackpad assembly 70 against the interior of upper wall, between trackpad assembly 70 and battery 68, and the like. This increase of pressure creates friction between the components and between the components and the upper 26 and lower walls 28, which can help maintain the positions of the components.

Additional wedge elements 102 can be positioned between, for example board assembly 74 and lower wall 28, between battery 68 and trackpad assembly 70, between board assembly 74 and keyboard assembly 72, or between any other adjacent components. Accordingly, board assembly 74, trackpad assembly 70, keyboard assembly 72, and any other components can also include inclined surfaces similar to surface 104 of battery 68. Further, wedge elements 102 can be attached to or integrally formed with, for example, board assembly 74 or hinge base portion 62 in the appropriate location to engage with, respectively battery 68 and board assembly 74. In another example, board assembly 74 itself can have a surface thereof that acts like a wedge and is configured to contact an appropriately configured inclined surface on keyboard assembly 72.

As shown in FIG. 4, lid housing 44, the structure of which is described above with respect to FIG. 3, is configured to receive a display assembly 60 therein. Display assembly 60 can include a computer screen 16 and various electronic components associated therewith. In an example, display assembly 60 can include a screen 16 in the form of an LCD screen and an associated light source, such as fluorescent lights, LED lights, or an OLED panel. Display assembly 60 can also include various components that are not necessarily associated with the display itself but can be strategically positioned within lid housing 44. Such components can include WiFi or cellular data (such as 3G, 4G, or LTE) antennae. Various electronic shielding structures can also be included in display assembly 60.

Display assembly 60 can be configured to be received within lid housing 44 such that a viewable area of screen 16 is aligned within display opening 58. Further, display assembly 60 can include one or more strategically positioned compliant inserts 100 similar to those discussed above with respect to base housing 24, above. As with the components of base 12, such inserts can serve to compensate for mechanical tolerance build up between display assembly 60 and lid housing 44 and can serve to provide a pressure-fit therebetween. Still further, wedge elements 102 similar to those described above with respect to FIG. 6 can also be positioned between display assembly 60 and lid housing 44.

As also shown, hinge assembly 18 includes a lid portion 64 (FIG. 6) that is attached to base portion 62 by joint 66, as described above. Hinge lid portion 64 is configured to assemble with lid housing 44 such that hinge lid portion 64 encloses the open end 56 of lid housing 44. In doing so, hinge lid portion 64 can secure display assembly 60 within lid housing 44 by contacting a portion of display assembly 60 adjacent open end 56. Additional foam inserts, such as inserts 100 shown in FIG. 6 can compensate for mechanical tolerances between hinge lid portion 64 and display assembly 60 and/or between display assembly 60 and the interior of front wall 50 of lid housing 44. Further, hinge lid portion 64 can include a raised portion 65 (FIG. 12) that can span any open distance between portions of bezel wall 48 and that are respectively adjacent the side walls 52 and 54. Such a portion 65 can be substantially flush with bezel wall 48 in the assembled computer 10 and can bound a bottom edge of the screen 16.

Figure 18:
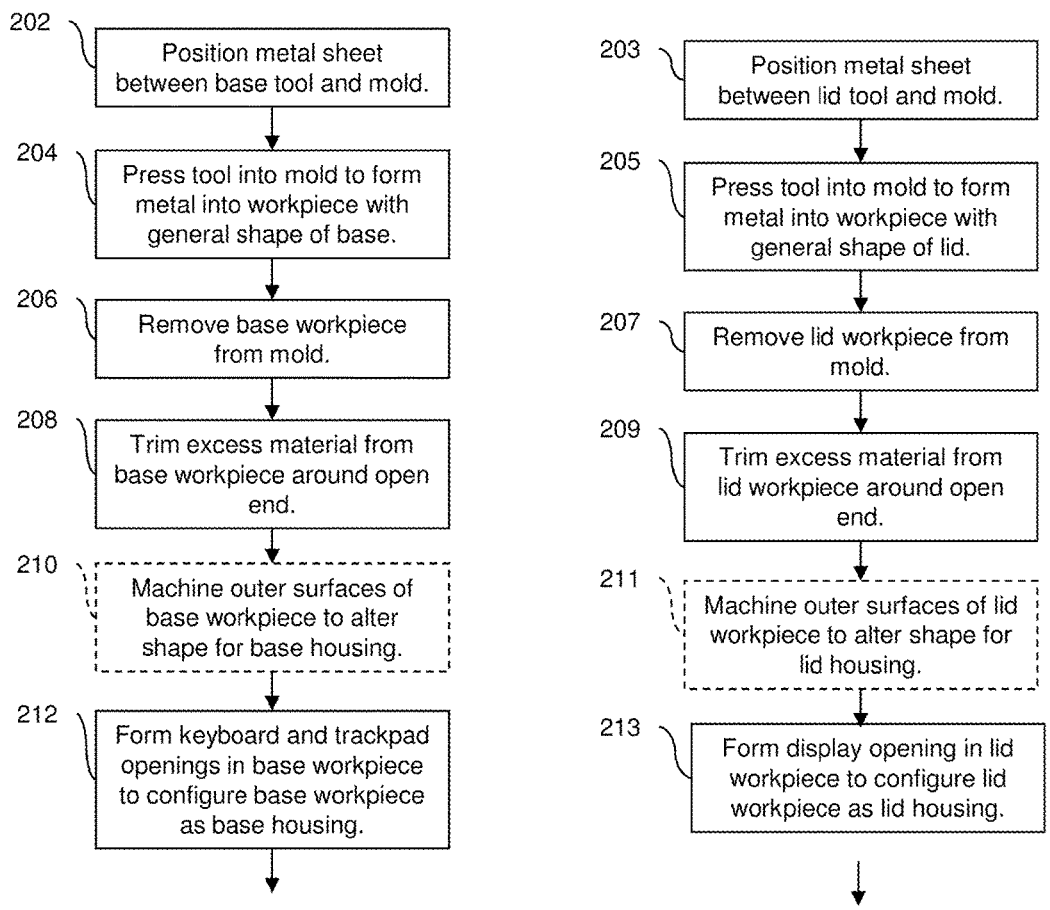
FIGS. 18A and 18B show flowcharts illustrating steps in a method of making computer housing components according to an aspect of the present disclosure.

As discussed above, base and lid housings 24 and 44 having of a single piece of material and being solidly joined between walls of the type described herein can be made from various materials including various metals or plastics using various fabrication methods. FIGS. 7-11 show various stages in one method for making the base housing 24 and the lid housing 44 for computer 10. Additionally, FIGS. 12-17 show various stages in making base assembly 12 and lid assembly 14 as fabricated by any means, including deep drawing as well as other processes, and assembling computer 10 from these assemblies. These steps are further depicted in the flowcharts shown in FIGS. 18A, 18B, and 19.

Figure 7:
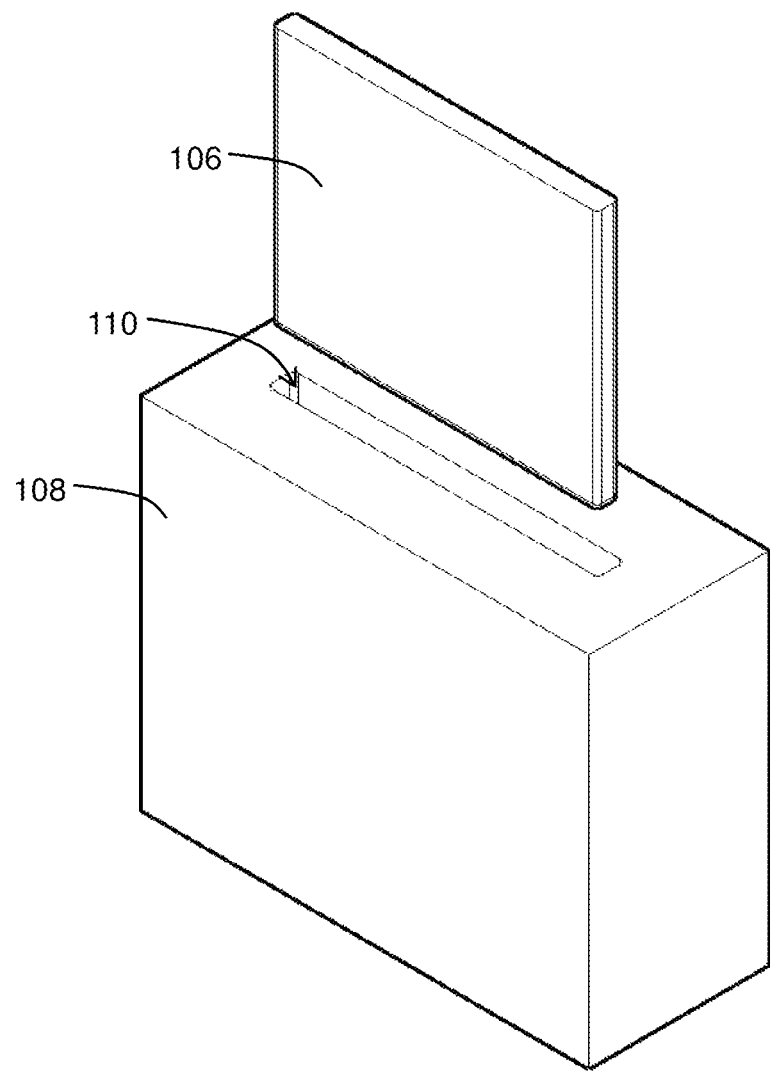
FIG. 7 shows portions of an apparatus that can be used to make portions of a housing for the portable computer of FIG. 1 in a method according to another embodiment of the present disclosure.

In the deep drawing example of FIGS. 7-11, 18A and 18B, base housing 24 and lid housing 44 can be made using a tool 106 and a mold 108 as shown in FIG. 7. Tool 106 can be generally in the shape desired for the interior 38 of base housing 24 and mold 108 can include a cavity 110 that is generally in the negative of a shape desired for the outer surfaces of base housing 24. The tool 106 and mold 108 can be configured to be used with machinery (not shown) that is specifically adapted to carry out a deep drawing process using tool 106 and mold 108. The tool 106 and mold 108 can also be configured to form housings 24 of various designs, sizes, shapes or other configurations, in addition to the variation of housing 24 shown in the Figures.

Figure 8:
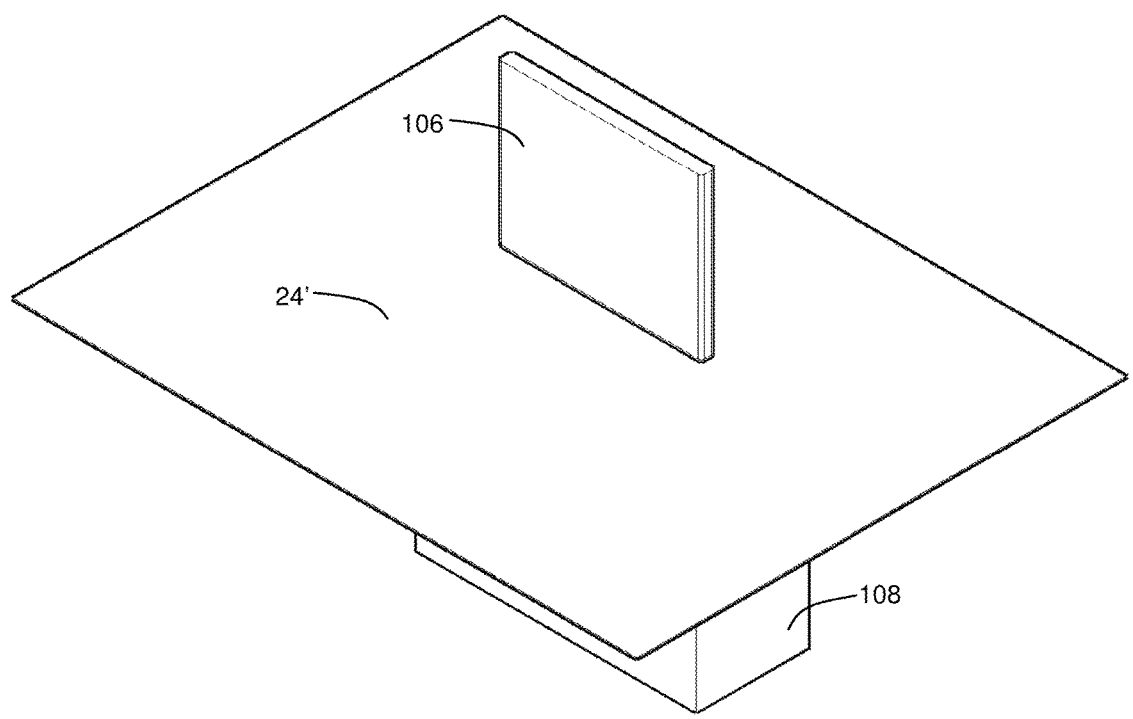
FIG. 8 shows a step in the method including the apparatus portions of FIG. 7 and a workpiece.

As shown in FIG. 8, a workpiece 24' in the form of a generally flat metal sheet can be positioned between the tool 106 and the mold 108 when the tool 106 and the mold 108 are in a pre-forming position with tool 106 withdrawn from cavity 110 (step 202 in FIG. 18A). The workpiece 24' can be of any of the above-described materials suitable for the formation of base housing 24 and can have a thickness that is approximately equal to the desired thickness for the various walls of base housing 24. In some embodiments, the initial thickness of workpiece 24' can be thicker than the desired final wall thickness for base housing 24 to compensate for a reduction in material thickness due to stretching of the material during the drawing process or to compensate for material removal in optional finishing processes, described below. In an example, the above-described process can be carried out to achieve a final material thickness of about 0.6 mm (+/−5%) for a base housing 24 or a lid housing 44 made from stainless steel or about 0.8 mm (+/−5%) for a base housing 24 or lid housing 44 made from aluminum. In other examples wherein base housing 24 or lid housing 44 is made from various plastics, the fabrication processes associated therewith can be configured to achieve a final material thickness of between about 1.5 mm and 2 mm (+/−5%).

Figure 9:
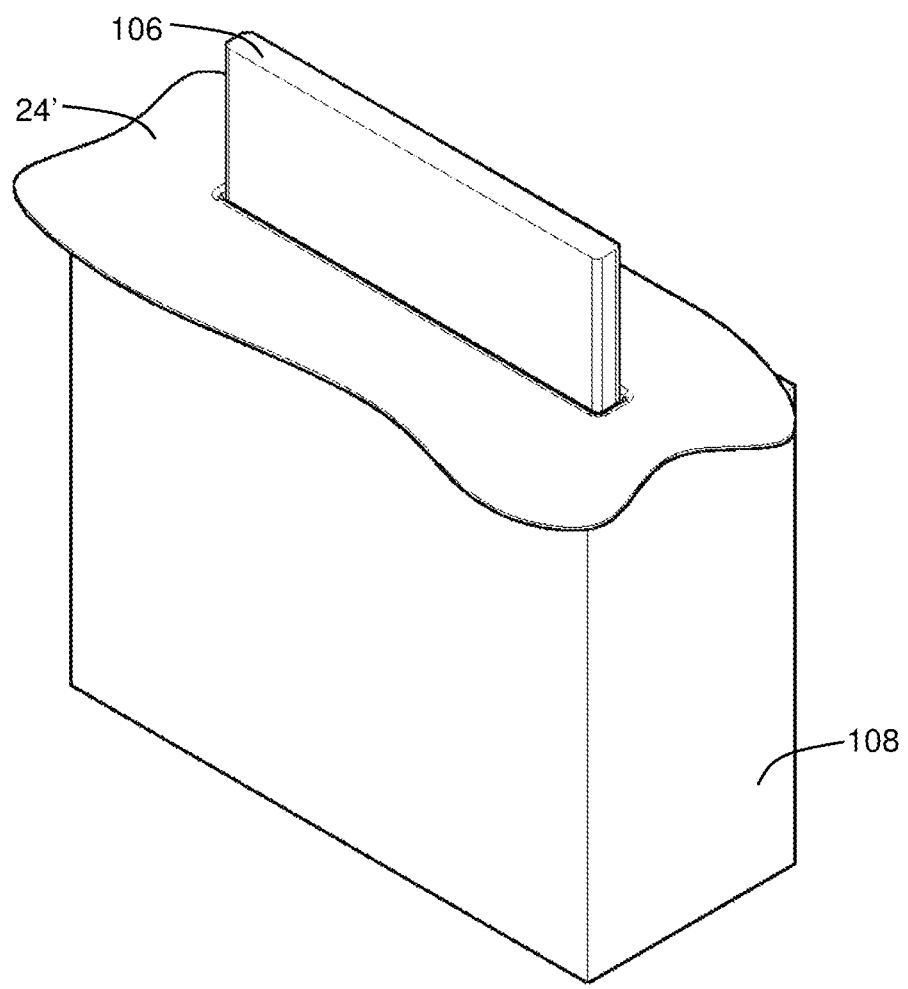
FIG. 9 shows another step in the method wherein the apparatus is used to at least partially shape the workpiece.

In the deep-drawing process, the tool 106 is driven into cavity 110 with workpiece 24' positioned between tool 102 and mold 108 (step 204 in FIG. 18A), which can be done by application of constant pressure thereto or by repeated impacting of tool 106 into cavity 110. This driving action causes plastic deformation of workpiece 24' as it is pushed into the shape of the area defined between tool 106 and cavity 110, as shown in FIG. 9. As shown, the driving direction of tool 106 is generally carried out in a direction between what will be the open end 36 and the front wall 30 of the housing 24. The driving process and the accompanying deformation process can be continued until the workpiece 24' reaches the end of the cavity 110, which generally gives the form of font wall 30. At such a point, the tool 106 can then be withdrawn from the cavity 110 and the deformed workpiece 24' removed from either the cavity 110 or the tool 106. In an embodiment, workpiece 24' can be heated prior to the deformation process described above. Such heating can be carried to make the workpiece 24' more pliable (but while still remaining solid) and, therefore, more amenable to the deep drawing process.

Figure 10:
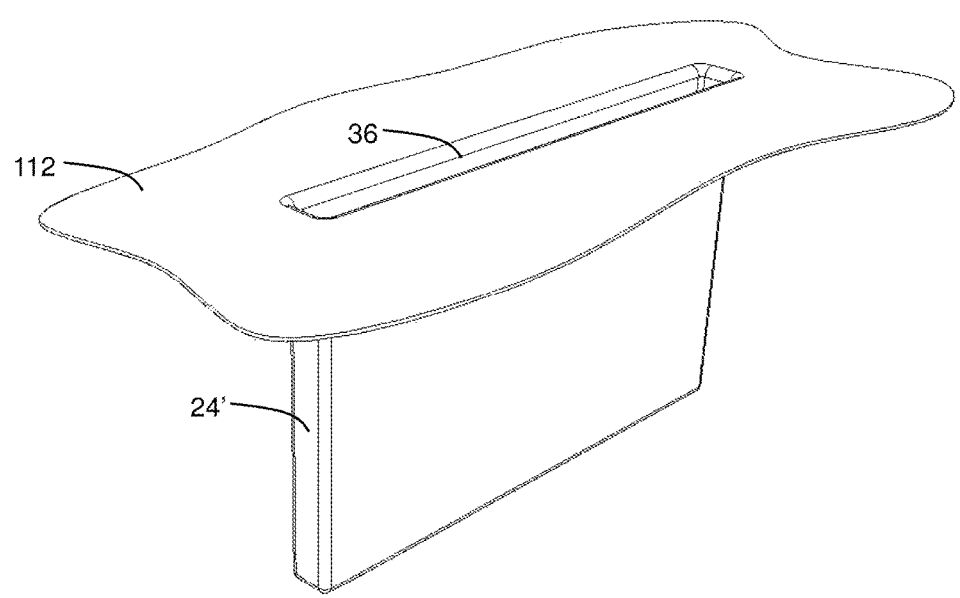
FIG. 10 shows the workpiece of FIG. 9 during a subsequent method step for making a base housing.
Figure 11:
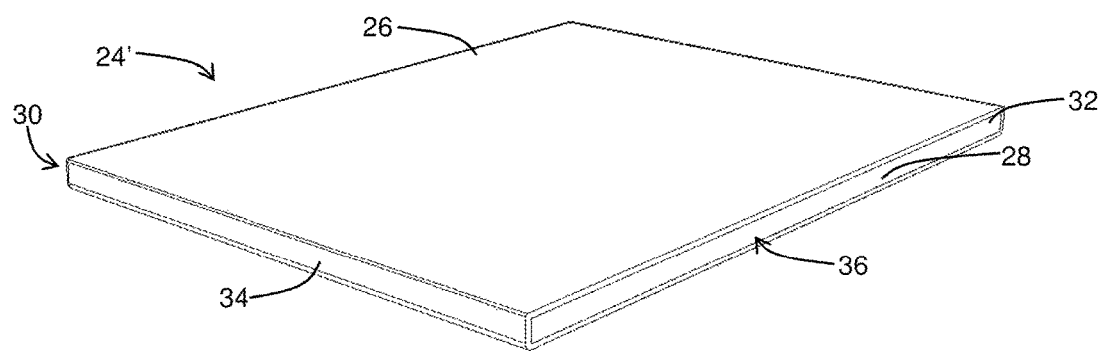
FIG. 11 shows the workpiece of FIG. 10 during another subsequent method step for making a base housing.

As shown in FIG. 10, the deformed workpiece 24' can include excess material 112 around what will be open end 36 upon removal from the mold 108 (step 206 in FIG. 18A). As shown in FIG. 11, this excess material 112 can be removed by cutting, which can be done by a saw, by a laser or the like, or by a machining process (step 208 in FIG. 18A). After such removal, workpiece 24' can have the general shape desired for base housing 24, including upper wall 26, lower wall 28, front wall 30, and side walls 32 and 34 as well as open end 36, as shown in FIG. 11.

Subsequently, trackpad opening 42, keyboard opening 40 and port openings 43 can be formed in workpiece 24' (step 212 in FIG. 18A), resulting in the structure of housing 24 shown in FIG. 2. This can be done by laser cutting, by machining, or by a combination of drilling and physical cutting using a saw or the like. A similar process using an appropriately-configured tool and mold combination can also be used to make lid housing 44, which can also include cutting an appropriately-shaped display opening 60 (steps 203-213 in FIG. 18B). In the above-mentioned injection-molding and die-casting process, the keyboard, trackpad, and display openings 40, 42, and 60 can be formed in connection with such molding by including these features in any molds used. Alternatively, these openings 40, 42, and 60 can be formed in subsequent steps, as described in connection with the deep drawing process.

Additional finishing processes can be applied to base housing 24 at any point after formation thereof. Such processes include machining the exterior thereof to remove excess wall thickness or to give a particular shape such as by reducing corner radii or the like (steps 210 in FIG. 18A and 211 in FIG. 18B). Additionally, the exterior of base housing 24 can be anodized, painted, sealed or otherwise treated.

Figure 12:
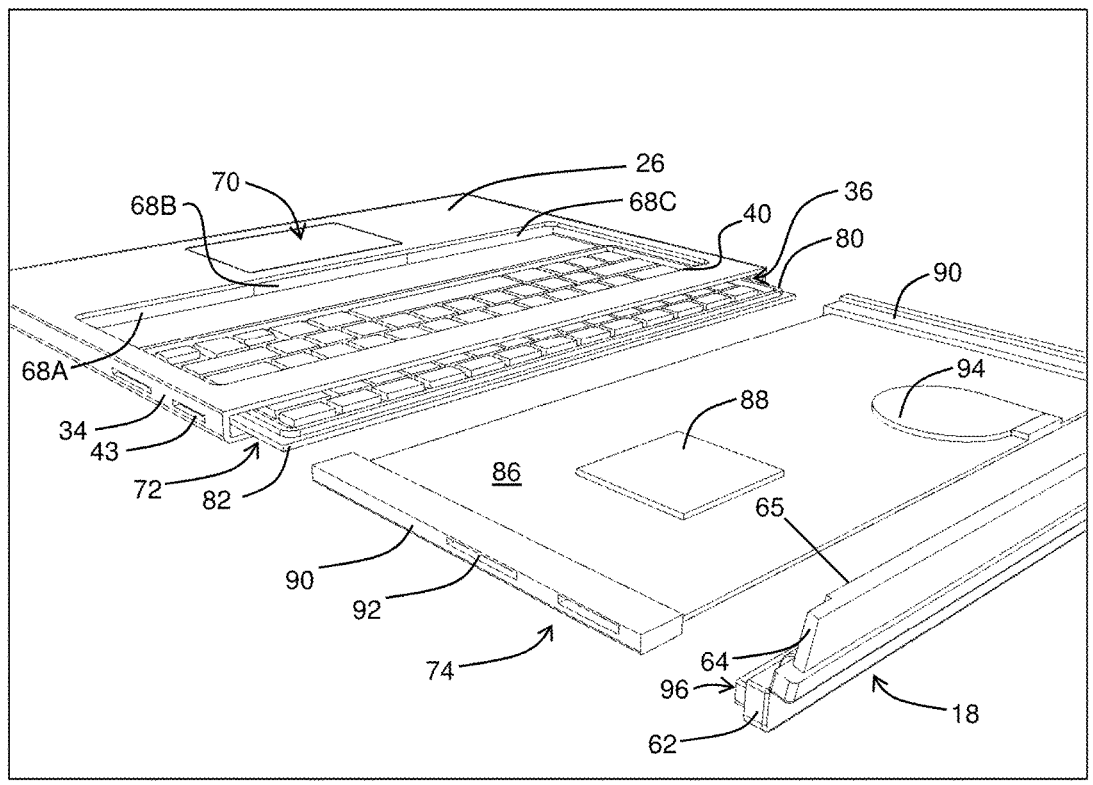
FIG. 12 shows a step of the method including assembling various electronic components into the base housing.
Figure 19:
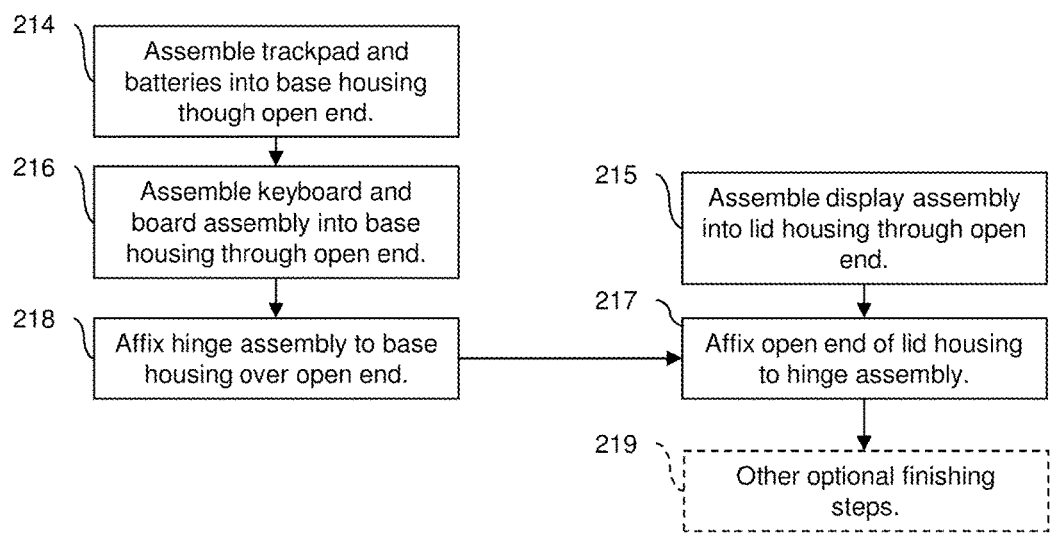
FIG. 19 shows a flowchart illustrating steps in a method of assembling housing components with other components to make a computer according to an aspect of the present disclosure.

After formation of base housing 24 and lid housing 44, the various internal components of computer 10, which can be done according to the deep drawing process, as described above, or the previously mentioned injection molding or die-casting methods, can be assembled into the respective housings (steps 214-216 in FIG. 19). As shown in FIG. 12, the various components associated with base housing 24 can be inserted thereinto through open end 36. The components can be inserted in stages and positioned as desired before subsequent components are placed into housing 24. In an example, trackpad assembly 70 can be placed into housing 24 first and positioned within opening 42, after which batteries 68 can be positioned adjacent front wall 30 and beneath trackpad assembly 70 (step 214 in FIG. 19). Electrical connections between components can be made during assembly, such as by attachment of mutually-engaging plugs or outlets or the like.

Figure 13:
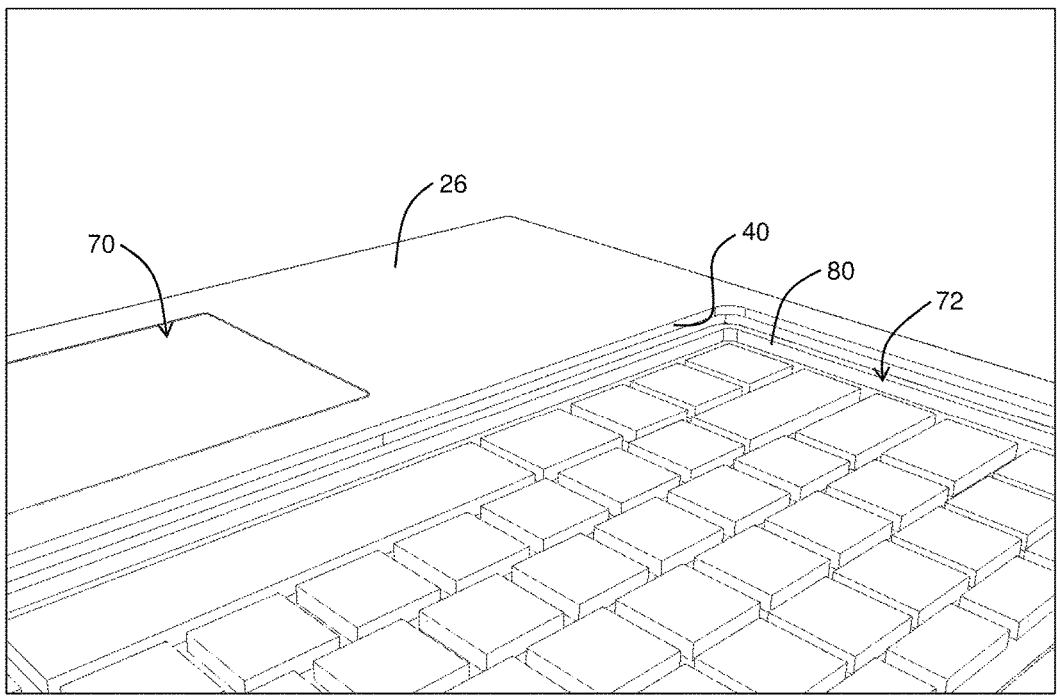
FIG. 13 shows a detail view of a subsequent assembly step.
Figure 14:
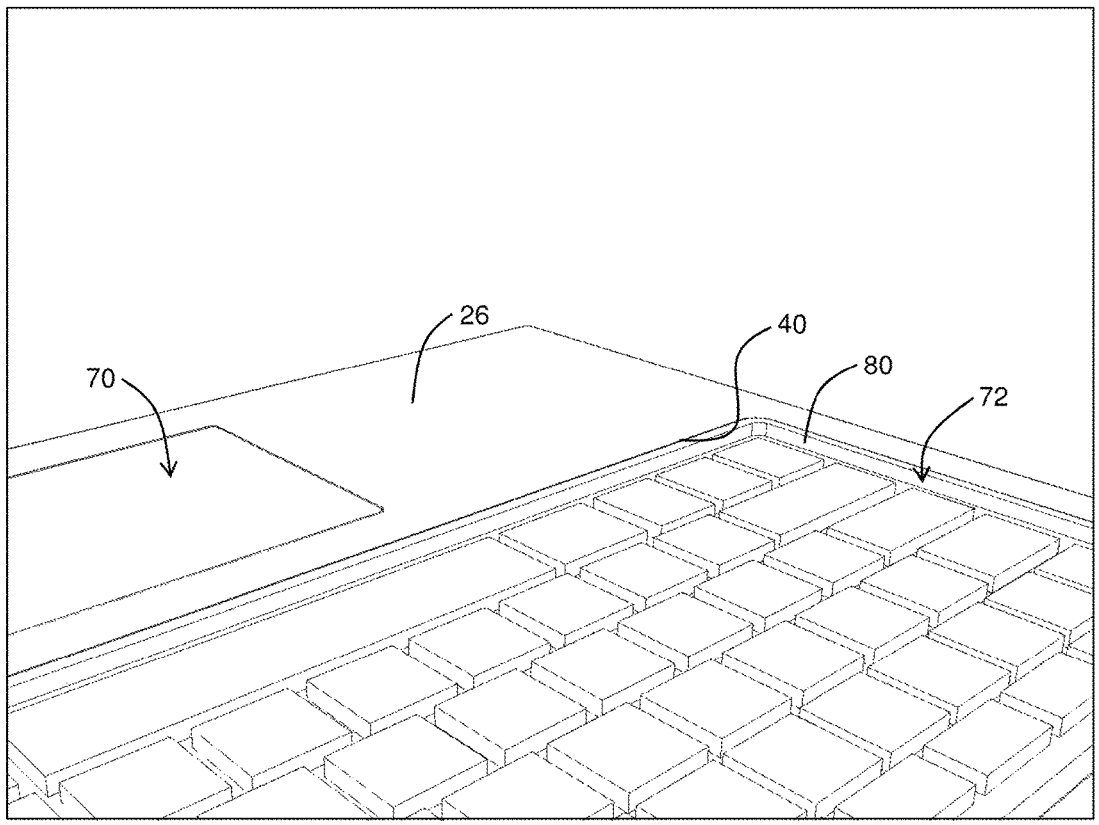
FIG. 14 shows a detail view of another subsequent assembly step.
Figure 15:
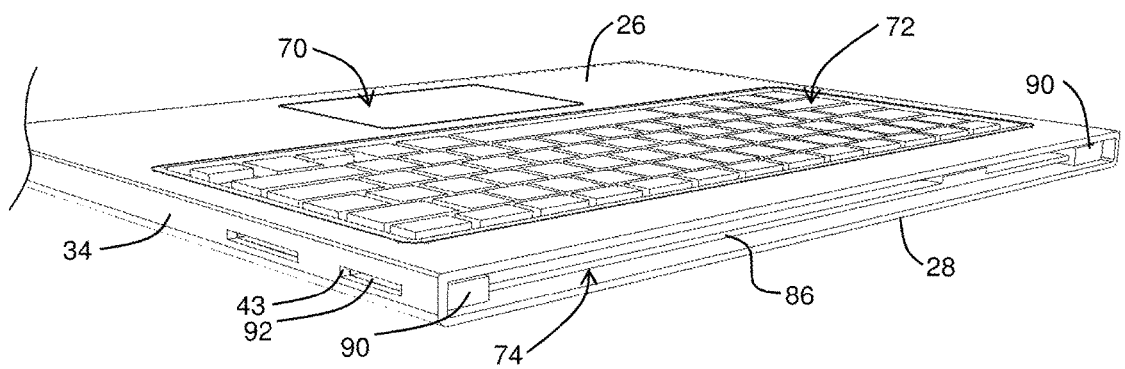
FIG. 15 shows a base housing with various electronic components assembled therein.

Subsequently, keyboard assembly 72 can be inserted within housing 24 through open end 36, as shown in FIG. 12 (step 216 in FIG. 19). Keyboard assembly 72 can then be positioned such that raised portion 80 is aligned with keyboard opening 40, as shown in FIG. 13. Keyboard assembly 72 can then be moved such that flange 82 contacts the interior of upper wall 26 and raised portion 80 is positioned within opening 40, as shown in FIG. 14. As explained above, the fit of raised portion 80 within opening 40 can keep keyboard assembly 72 appropriately positioned with within opening while flange 82 is maintained in contact with the interior of upper wall 26. By inserting board assembly 74 into the space between keyboard support 73 and the interior of lower wall 28, as discussed above, keyboard assembly 72 can be maintained in such a position.

Figure 16:
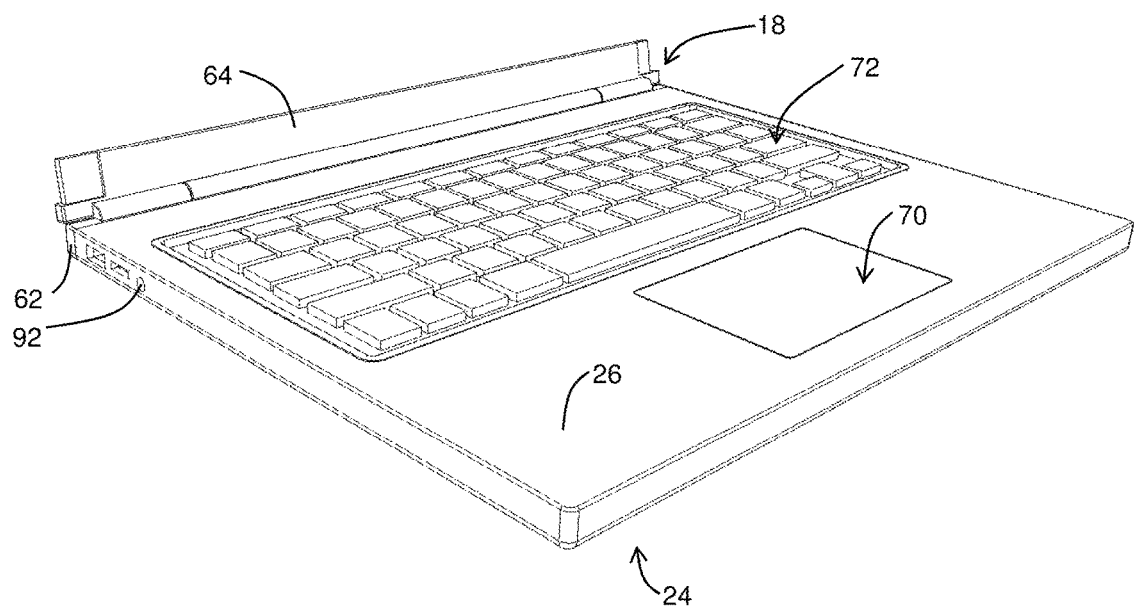
FIG. 16 shows the assembly of FIG. 15 with a hinge unit further assembled therewith.
Figure 17:
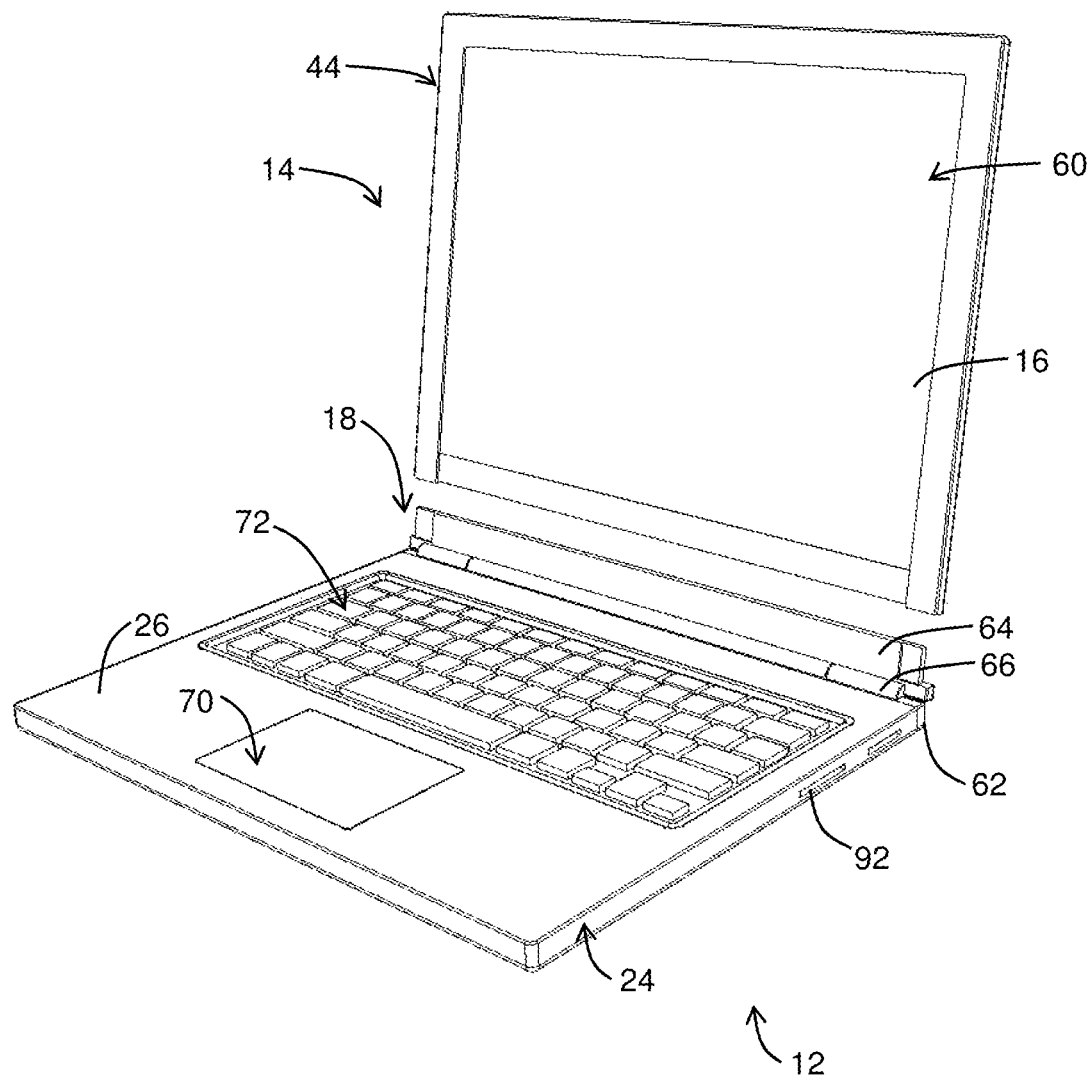
FIG. 17 shows a display assembly aligned with the assembly of FIG. 16 for assembly therewith.

Hinge assembly 18 can then be assembled with base assembly 12, as shown in FIG. 16, by attaching hinge base portion 26 to the open end 36 of base housing 24 (step 218 in FIG. 19). As discussed above, hinge base portion 26 can be configured to contact a portion of board assembly 74 such that the internal components of base 12 are maintained in desired positions thereof. It is noted that, in embodiments where wires are included in and through hinge assembly 18, such wires can be connected with other wires that can extend from, for example, board assembly 74 prior to attaching hinge assembly 18 to base housing 24. As discussed above, hinge base portion 62 can be attached to base housing 24 by screws, snap-fit or press-fit structures, adhesives or the like.

As discussed above, lid housing 44 can be made in a manner similar to that of base housing 24. In an example using deep drawing, lid housing 44 can be made by deep drawing a sheet of metal in a direction away from what will become open end 56. Subsequently, display opening 58 can be cut in bezel wall 48, as discussed above (step 213 in FIG. 18). Display assembly 60 can then be assembled with lid housing 44 resulting in lid assembly 14 (step 215 in FIG. 19). Lid assembly 14 can then be assembled with hinge assembly 18 by attaching hinge lid portion 64 to open end 56 of lid housing 44, which can be done in a similar manner to the attachment of hinge base portion 62 with open end 36 of base housing 24 (step 217 in FIG. 18). Any wires that require connection between display assembly 60 and hinge assembly 18 can be connected prior to the attachment of hinge lid portion 64 with open end 56. It is noted that base assembly 12, lid assembly 14, and hinge assembly 18 can be conducted in parallel or in any sequence desired before assembly together. Further, lid assembly 14 can be assembled with hinge 18 before assembly with base 12, if desired. Additional finishing steps can also be carried out after the computer has been assembled, including cleaning, painting, packaging, battery charging, etc. (step 219 in FIG. 18).

Housings of a similar configuration to those described above in the context of a notebook computer can be used in other electronic devices as well. For example, a similar configuration of two assemblies including single-piece housings of the general form discussed above and connected with a hinge that covers open ends of the housings can be implemented in mobile telephones. In other examples, a single assembly having a single housing of the type discussed above with a cover over an open end thereof that helps maintain various positions of internal components of the device can be used in smartphones, tablet computers, e-readers or the like. Further, such housing configurations can be implemented in peripheral electronic devices, including keyboards and the like.

Although the description herein has been made with reference to particular embodiments, it is to be understood that these embodiments are merely illustrative of the principles and applications of the present disclosure. It is therefore to be understood that numerous modifications may be made to the illustrative embodiments and that other arrange-

The invention claimed is:

1. A method of fabricating a computing device housing, the method comprising:
   positioning a first metal sheet of predetermined size and thickness between a first tool and a first mold;
   pressing the first metal sheet into the first mold using the first tool to form a base housing having a unitary material structure, the base housing defining a length, a width, and a height that is less than both the length and the width, the base housing having at least five side walls defining an internal cavity and an open end to the internal cavity that spans the width and height of the base housing, the at least five side walls including a first major wall spanning the length and width of the housing, a second major wall spanning the length and width of the housing, and a first side wall spanning the width and height of the base housing positioned opposite the open end to the internal cavity;
   removing the base housing from the mold;
   forming one or more openings in at least one of the side walls of the base housing;
   sliding one or more electronic components through the open end into the internal cavity of the base housing such that the one or more electronic components are contained within the internal cavity of the base housing, wherein each of the one or more openings is arranged to expose a respective one of the one or more electronic components;
   positioning a second metal sheet of predetermined size and thickness between a second tool and a second mold;
   pressing the second metal sheet into the second mold using the second tool to form a lid housing having a unitary material structure, the lid housing defining a length, a width, and a height that is less than both the length and the width, the lid housing having at least four walls defining a display opening and an open end adjacent to the display opening;
   removing the lid housing from the second mold;
   sliding a display assembly through the open end of the lid housing so that a display unit of the display assembly is exposed within the display opening;
   affixing a hinge assembly to the base housing over the open end to the cavity; and
   affixing the hinge assembly to the lid housing.

2. The method of claim 1, wherein affixing the hinge assembly to the base housing and to the lid housing includes electrically coupling a selected one of the one or more electronic components to the display unit.

3. The method of claim 1, further comprising inserting a shim member between one of the side walls of the base housing and a given one of the one or more electronic components.

4. The method of claim 3, wherein the shim member is part of another one of the one or more electronic components, and inserting the shim member includes inserting the other electronic component through the open end of the base housing into the cavity.

5. The method of claim 1, further comprising:
   positioning a selected one of the one or more electronic components within a space defined between two spaced apart and parallel ones of the side walls of the base housing;
   wedging a shim member between the selected electronic component and a first one of the two spaced apart and parallel side walls; and
   placing at least a portion of the selected electronic component against a second one of the two spaced apart and parallel side walls.

6. The method of claim 1, wherein sliding the one or more electronic components through the open end into the internal cavity of the base housing includes:
   sliding a first one of the electronic components into the internal cavity;
   positioning the first electronic component within the internal cavity in a predetermined location;
   upon positioning the first electronic component, sliding a second one of the electronic components into the internal cavity; and
   providing an electrical or mechanical connection between the first and second electronic components.

7. The method of claim 1, further comprising, after removing the base housing from the first mold, removing excess material from the unitary material structure of the base housing.

8. The method of claim 1, wherein sliding the one or more electronic components through the open end into the internal cavity of the base housing includes positioning each of the one or more electronic components in contact with one of the at least five side walls or another electronic component of the one or more electronic components.

* * * * *